(12) United States Patent
Horimoto

(10) Patent No.: US 6,936,911 B1
(45) Date of Patent: Aug. 30, 2005

(54) SEMICONDUCTOR INTEGRATED CIRCUIT DEVICE

(75) Inventor: Masashi Horimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/496,017

(22) Filed: Feb. 1, 2000

(30) Foreign Application Priority Data

Feb. 2, 1999 (JP) .............................................. 11-024518

(51) Int. Cl.$^7$ ....................... H01L 23/52; H01L 27/102; H01L 29/74; H02H 3/00
(52) U.S. Cl. ....................... 257/665; 257/691; 257/170; 257/177; 257/167; 257/584; 257/587; 361/1
(58) Field of Search ................................. 257/170, 177, 257/167, 584, 587, 691

(56) References Cited

U.S. PATENT DOCUMENTS 5,920,227 A * 7/1999 An

* cited by examiner

Primary Examiner—David E. Graybill
Assistant Examiner—James Mitchell
(74) Attorney, Agent, or Firm—Arent Fox, PLLC.

(57) ABSTRACT

A semiconductor integrated circuit device has a semiconductor integrated circuit chip, a package enclosing the chip, and a plurality of conductors connecting the bonding pads of the chip to the leads of the package. The chip has an internal circuit, a plurality of bonding pads having signal paths formed between themselves and the internal circuit, and a switching circuit provided in a predetermined signal path so as to perform a switching operation to allow the internal circuit to be connected selectively to one of different bonding pads. The switching circuit is fed with an external signal to perform its switching operation in such a way as to prevent the signals passing through mutually adjacent conductors from affecting each other.

5 Claims, 3 Drawing Sheets

SEMICONDUCTOR INTEGRATED CIRCUIT DEVICE

BACKGROUND OF THE INVENTION

1. Field of the Invention

The present invention relates to a semiconductor integrated circuit device.

2. Description of the Prior Art

In general, a semiconductor integrated circuit device has a plurality of leads provided in an edge portion of the package thereof so as to project therefrom for connection to a printed circuit board.

On the other hand, a semiconductor integrated circuit device has an integrated circuit chip enclosed in a central portion of the package thereof, and the chip has a plurality of bonding pads provided thereon that are connected individually to the leads of the package by wire bonding. That is, input and output of signals to and from the internal circuit of the chip is achieved by way of bonding pads corresponding to the individual signals.

However, the signals input to and output from the internal circuit have different amplitudes from one another, and therefore, when wires are bonded, it is necessary to select appropriate leads to prevent two signals having greatly different amplitudes from being input or output by way of leads too close to each other. This helps alleviate problems such as crosstalk, but with limited result in exchange for much inconvenience.

Such a chip can be enclosed also in a package of a BGA (ball grid array) type. In the case, the signals corresponding to the bonding pads provided on the chip is input thereto or output therefrom by way of solder pads from or to the bonding pads provided on the package.

If the two signals are transferred by way of two solder pads that are too close to each other, problems such as crosstalk occur; moreover, also on the part of the printed circuit board on which the BGA package is mounted, problems occur with the conductive patterns that are laid so as to be connected individually to those two solder pads. Such problems can be avoided by assigning the above-mentioned two signals to different bonding pads, but this requires modification of the masking pattern of the chip, and thus cannot be achieved readily.

SUMMARY OF THE INVENTION

An object of the present invention is to provide a semiconductor integrated circuit device that allows easy prevention of crosstalk.

To achieve the above object, according to the present invention, a semiconductor integrated circuit device is provided with: a semiconductor integrated circuit chip which comprises an internal circuit, a plurality of bonding pads having signal paths formed between themselves and the internal circuit, a switching circuit provided in a predetermined signal path so as to perform a switching operation to permit the internal circuit to be connected selectively to one of different bonding pads, and means for feeding a switching signal to the switching circuit; a package enclosing the semiconductor integrated circuit chip and having a plurality of leads for connection to a printed circuit board; a plurality of conductors for connecting the bonding pads of the semiconductor integrated circuit chip to the leads of the package; and means for controlling the switching operation of the switching circuit in such a way as to prevent signals passing through mutually adjacent conductors from affecting each other.

This semiconductor integrated circuit device allows a bonding pad that is originally assigned for input or output of a particular signal to be switched to another bonding pad. This makes it possible to handle signals having greatly different amplitudes via terminals that are located in positions well apart from each other. Thus, it is possible to prevent malfunctioning due to crosstalk and the like without any complicated process such as modification of the masking pattern.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
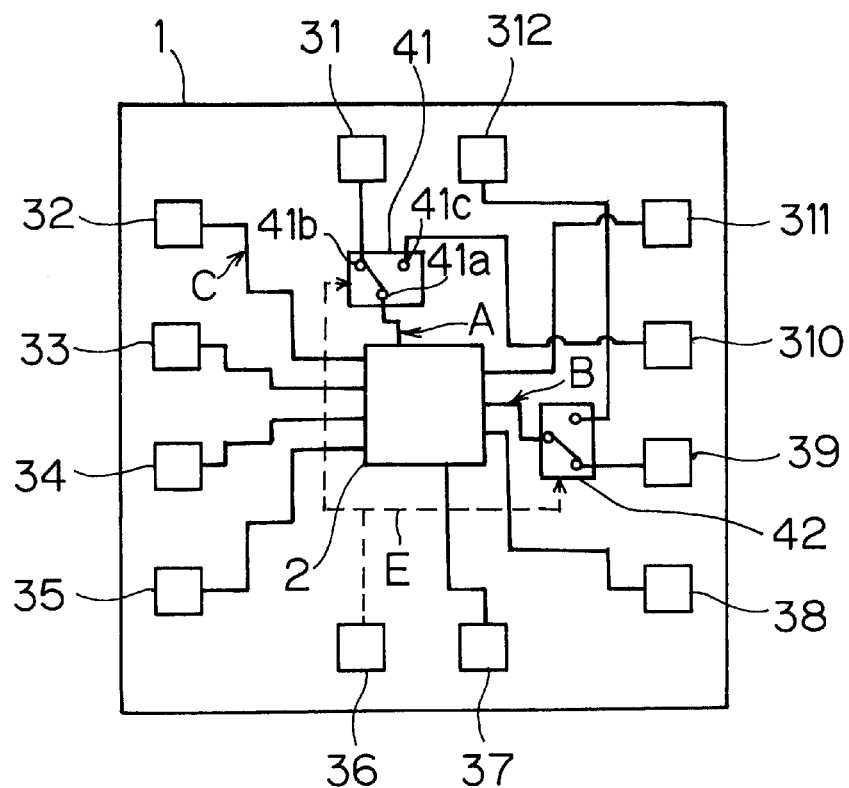
FIG. 1 is a plan view of an integrated circuit chip embodying the invention.

Hereinafter, embodiments of the present invention will be described with reference to the accompanying drawings. FIG. 1 is a plan view of an integrated circuit chip. This chip 1 is provided with an internal circuit 2 and bonding pads 31, 32, 33, 34, 35, 36, 37, 38, 39, 310, 311, and 312. Of these bonding pads, the bonding pads 32, 33, 34, 35, 37, 38, and 311 form signal paths by being connected directly to the internal circuit 2 by way of conductors.

The bonding pads 31 and 310 are connected to the internal circuit 2 through a switching circuit 41 provided in the middle of the conductor A, so that a signal path is formed between either of those bonding pads and the internal circuit 2 through this switching circuit 41. Similarly, the bonding pads 39 and 312 are connected to the internal circuit 2 through a switching circuit 42 provided in the middle of the conductor B, so that a signal path is formed between either of those bonding pads and the internal circuit 2 through this switching circuit 42.

The switching operation of these switching circuits 41 and 42 is controlled by a switching signal (switching voltage) fed in from the outside via the bonding pad 36. In the case of the chip 1 shown in FIG. 1, input and output of signals to and from the internal circuits 2 is achieved via the bonding pads 31, 32, 33, 34, 35, 37, 38, 39, and 311.

Figure 2:
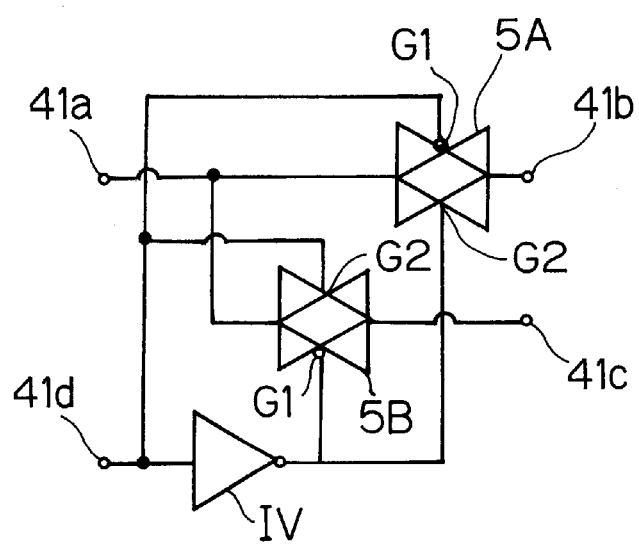
FIG. 2 is a circuit diagram of the switching circuit used in the integrated circuit chip shown in FIG. 1.

FIG. 2 shows the circuit configuration of the switching circuit 41. The switching circuit 41 has a terminal 41a connected, as shown in FIG. 1, to the internal circuit 2, a terminal 41b connected to the bonding pad 31, and a terminal 41c connected to the bonding pad 310. The switching circuit 41 further has a terminal 41d connected to the bonding pad 36. Reference numerals 5A and 5B represent analog switches, of which each is composed of, for example, a p-channel MOS transistor and an n-channel MOS transistor connected in parallel and thus has two control terminals G1 and G2 (the control terminals of the two constituent MOS transistors). The switch 5A is connected between the terminals 41a and 41b, has its control terminal G1 connected to the terminal 41d, and has its control terminal G2 connected through an inverter IV to the terminal 41d. The switch 5B has its control terminal G1 connected through the inverter IV to the terminal 41d, and has its control terminal G2 connected directly to the terminal 41d. Thus, the switches 5A and 5B operate in such a way that, when a high level is fed as the switching voltage to the terminal 41d, the switch 5B is turned on and the switch 5A is turned off, and, when a low level is fed to the terminal 41d, the switch 5A is turned on and the switch 5B is turned off. In FIG. 1, the conductor E, indicated by broken lines, for the switching voltage is laid in a different layer from the layer in which the other conductors (A, B, C, and so on) are laid. The switching circuit 42 is configured in the same manner as shown in FIG. 2. It is to be understood that the switching circuits 41 and 42 may be configured in any manner other than shown in FIG. 2.

Now, suppose that, in the above-described chip 1, the signal output from the internal circuit 2 by way of the signal path A and the signal output therefrom by way of the signal path C so as to be fed out via the bonding pad 32 have greatly different amplitudes. In this case, the switching circuit 41 is so switched that its terminal 41a is connected to its terminal 41c so that the signal passing through the signal path A will be fed out via the bonding pad 310. This helps reduce crosstalk between the two signals.

Figure 3:
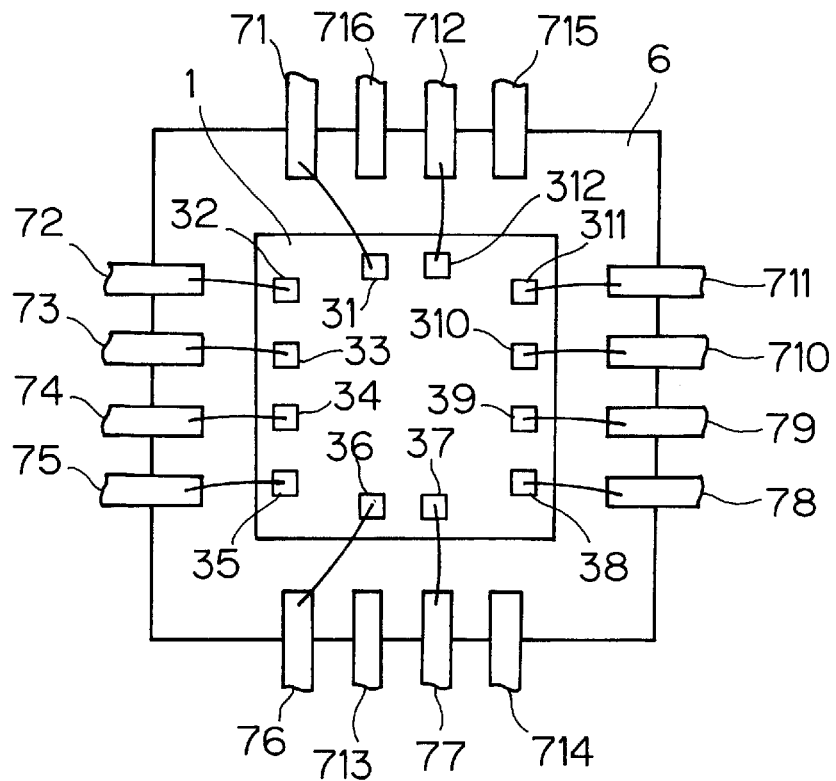
FIG. 3 is a plan view of a quad flat package embodying the invention.

FIG. 3 is a plan view showing the structure of a QFP (quad flat package) enclosing the above-described chip 1. This QFP has a plurality of leads 71, 72, 73, 74, 75, 76, 77, 78, 79, 710, 711, 712, 713, 714, 715, and 716 provided in an edge portion of the package 6 thereof so as to project therefrom for connection to a printed circuit board (not shown).

The QFP has the integrated circuit chip 1 enclosed in a central portion of the package 6 thereof, and the bonding pads 31, 32, 33, 34, 35, 36, 37, 38, 39, 310, 311, 312 provided on the chip 1 are connected respectively to the leads 71, ..., 712 provided on the package 6 by wire bonding. Thus, if the switching circuit 41 is switched as described above, the signal output from the internal circuit 2 to the signal path A will eventually be fed out via the lead 710 of the package 6.

Figure 4:
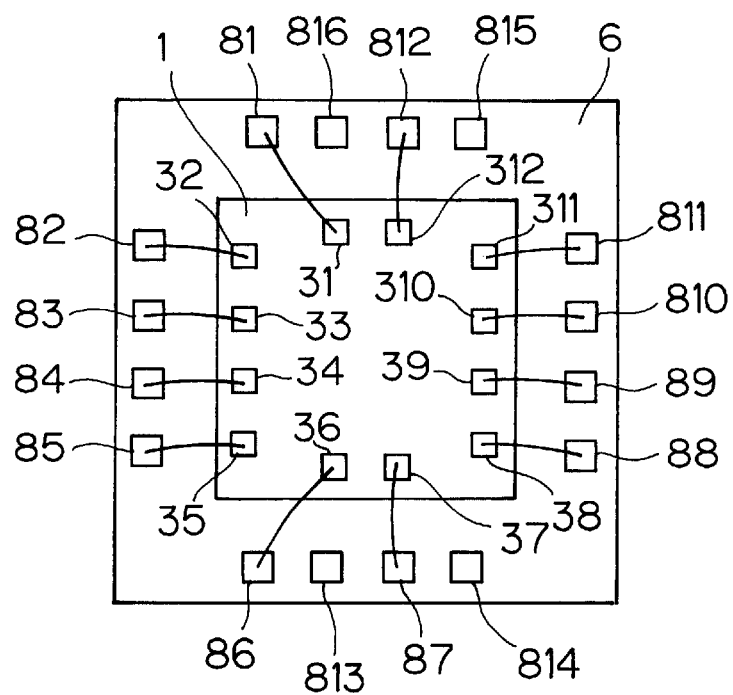
FIG. 4 is a plan view of a flip ball grid array embodying the invention.
Figure 5:
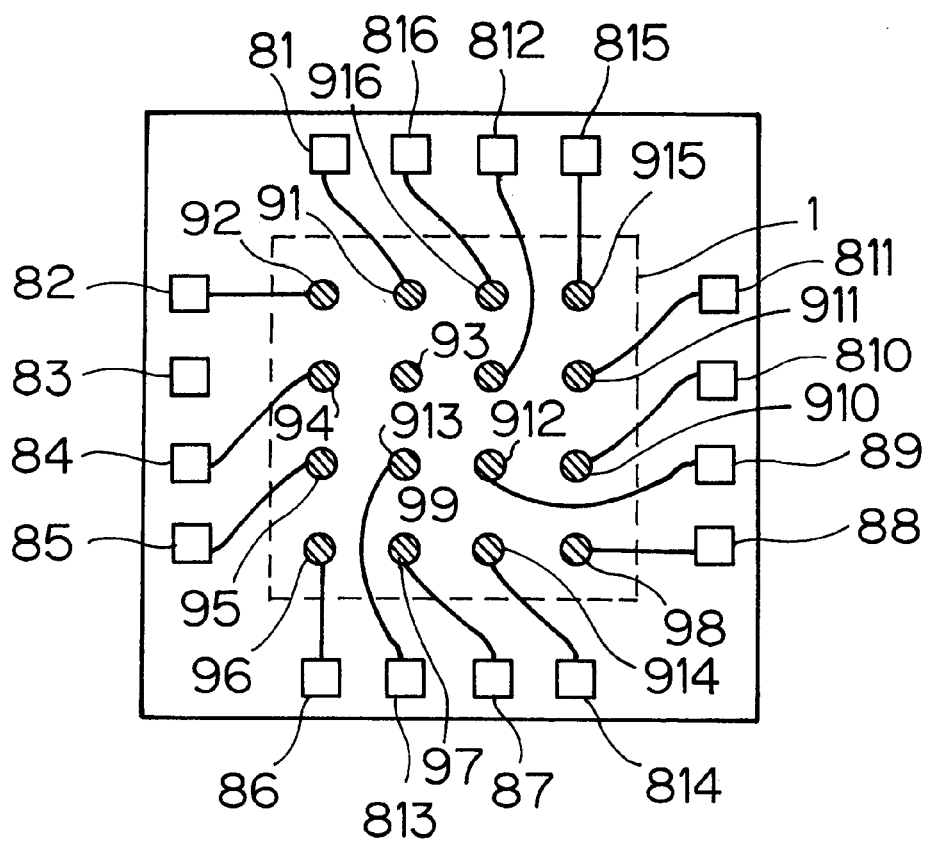
FIG. 5 is a diagram showing the state of the ball grid array shown in FIG. 4 when the chip is removed therefrom.

FIG. 4 shows a case in which a BGA (ball grid array) is used to enclose the chip 1. This BGA has a plurality of bonding pads 81, 82, 83, 84, 85, 86, 87, 88, 89, 810, 811, 812, 813, 814, 815, and 816 provided along an edge portion of the package 6 thereof. The BGA has the chip 1 enclosed in a central portion of the package 6 thereof, and the bonding pads 31, ..., 312 provided on the chip 1 are connected respectively to the bonding pads 81, ..., 812 provided on the package 6 by wire bonding. FIG. 5 is a diagram showing the state of the BGA when the chip 1 is removed from the package 6. In the central portion of the package 6, a plurality of solder pads 91, 92, 93, 94, 95, 96, 97, 98, 99, 910, 911, 912, 913, 914, 915, and 916 are arranged in a grid-like array. These solder pads 91, ..., 916 are exposed also on the bottom surface of the package 6 for the package 6 for connection to a printed circuit board (not shown).

Now, suppose that, in the chip 1, the switch circuit 41 is so switched that its terminal 41a is connected to its terminal 41b as shown in FIG. 1. In this case, the output signal from the bonding pad 31 is transferred via the bonding pad 81 on the package 6 so as to be fed out via the solder pad 91 (see FIG. 5). On the other hand, the output signal from the bonding pad 33 is transferred via the bonding pad 83 on the package 6 so as to be fed out via the solder pad 93 (see FIG. 5). Here, since the solder pads 91 and 93 are close to each other, crosstalk is likely to occur.

To avoid this, in the chip 1, by feeding an input signal to the bonding pad 36, the switching circuit 41 is so switched that the signal path A is connected to the bonding pad 310. Then, the signal is output from the bonding pad 310, and is then transferred via the bonding pad 810 of the package 6 of the BGA so as to be fed out via the solder pad 910. Now, the solder pad 910 is well apart from the solder pad 93, and thus crosstalk or the like is unlikely to occur.

It is to be understood that the present invention may be practiced in any other way than is specifically described above. For example, the chip may be provided with any number of bonding pads, and may be provided with any number of switching circuits in any signal paths. Moreover, although the examples described above deal only with arrangements using a QFP or BGA, the present invention is applicable also to arrangements using a package of any other type.

What is claimed is:

1. A semiconductor integrated circuit device comprising:
   a semiconductor integrated circuit chip which comprises an internal circuit, a plurality of bonding pads having signal paths formed between themselves and the internal circuit, a switching circuit provided in a predetermined signal path so as to perform a switching operation to permit the internal circuit to be connected selectively to one of different bonding pads and form a single signal path therein, and means for feeding a switching signal to the switching circuit;
   a package enclosing the semiconductor integrated circuit chip and having a plurality of leads for connection to a printed circuit board;
   a plurality of conductors for connecting the bonding pads of the semiconductor integrated circuit chip to the leads of the package; and
   means for controlling the switching operation of the switching circuit in such a way that, when mutually adjacent conductors are arranged so close to each other that signals passing therethrough affect each other, a third conductor is used instead of one of said conductors so as to keep a distance from the other.

2. A semiconductor integrated circuit device as claimed in claim 1,
   wherein the bonding pads connected to the switching circuit are not adjacent to each other, and, while one of those bonding pads is being selected by the switching circuit, the other is kept disconnected from any one of signal paths and kept in an unused state.

3. A semiconductor integrated circuit device comprising:
   a semiconductor integrated circuit chip which comprises an internal circuit, a plurality of bonding pads having signal paths formed between themselves and the internal circuit, a switching circuit provided in a predetermined signal path so as to perform a switching operation to permit the internal circuit to be connected selectively to one of different bonding pads and form a single signal path therein, and means for feeding switching signal to the switching circuit;
   a package enclosing the semiconductor integrated circuit chip and having a plurality of pads for connection to a printed circuit board;
   a plurality of conductors for connecting the bonding pads of the semiconductor integrated circuit chip to the pads of the package; and
   means for controlling the switching operation of the switching circuit in such a way that, when mutually adjacent conductors are arranged so close to each other that signals passing therethrough affect each other, a third conductor is used instead of one of said conductors so as to keep a distance from the other.

4. A semiconductor integrated circuit device as claimed in claim 3, wherein the package is of a ball grid array type.

5. A semiconductor integrated circuit device comprising an internal circuit and a plurality of bonding pads each having a signal path formed between itself and the internal circuit, wherein switching means is provided to permit a signal that is originally planned to be input to or output from the internal circuit via one of the plurality of bonding pads to be input to or output from the internal circuit via another of the plurality of bonding pads in accordance with how terminals are arranged in a package that is used to enclose the semiconductor integrated circuit device, and when the signal via another of the plurality of bonding pads is permitted, the one of the plurality of bonding pads does not form a signal path, is kept disconnected therefrom, and is kept in an unused state.

* * * * *